United States Patent [19]

Cannon

[11] 3,723,910

[45] Mar. 27, 1973

[54] MIXING CIRCUIT UTILIZING LINEAR RESISTANCES

[75] Inventor: James D. Cannon, Tucson, Ariz.

[73] Assignee: Motorola Inc., Franklin Park, Ark.

[22] Filed: May 20, 1971

[21] Appl. No.: 145,256

[52] U.S. Cl.....................332/31 T, 307/251, 329/50, 329/101, 332/43 B, 332/44

[51] Int. Cl................................................H03c 1/54

[58] Field of Search...............332/31 T, 43 B, 44, 45; 307/251; 329/50, 101

[56] References Cited

UNITED STATES PATENTS

| | | | |
|---|---|---|---|
| 3,551,850 | 12/1970 | Rudolph et al. | 332/44 |
| 3,435,375 | 3/1969 | Miller | 307/251 X |
| 3,371,290 | 2/1968 | Kibler | 332/31 T X |
| 3,424,990 | 1/1969 | Escobosa | 329/50 |
| 3,510,684 | 5/1970 | Martin | 307/251 X |
| 3,621,474 | 11/1971 | Banasiewicz | 332/31 T X |

*Primary Examiner*—Alfred L. Brody
*Attorney*—Mueller & Aichele

[57] ABSTRACT

The mixing circuit employs the linear portions of the voltage-current characteristics of a plurality of field-effect transistors to amplitude modulate a first signal, having a first frequency, with a second signal having a second frequency thus providing an amplitude modulated signal. A differential amplifier is connected to the field-effect transistors and to the source of the first signal so that the common-mode rejection characteristic thereof is utilized to eliminate the undesired component at the first frequency from the amplitude modulated signal. As a result, virtually only the desired signal components having frequencies equal to the sum and difference of the first and second frequencies occur at the output of the amplifier.

8 Claims, 6 Drawing Figures

INVENTOR
JAMES D. CANNON
BY
Mueller & Aichele
ATTYS.

MIXING CIRCUIT UTILIZING LINEAR RESISTANCES

BACKGROUND OF THE INVENTION

A mixing circuit which can "multiply" two sinusoidal input signals together to produce an output signal having frequencies at the values of the sum and difference frequencies of the input signals is desirable for a variety of signal processing applications in electronic systems. For instance, a double sideband, suppressed carrier transmitter may employ a balanced modulator to which is applied a carrier or first sinusoidal input signal at a radio frequency and a modulating or second sinusoidal input signal which may be at an audio frequency. The desired double sideband output of the balanced modulator includes frequencies only at the sum and difference of the modulating and carrier frequencies. If a single sideband signal is desired, one of the sidebands at the output of the balanced modulator may be eliminated by a selective, bandpass filter. Moreover, in a single sideband receiver, a product detector may be employed to mix a received sideband or first input signal with a locally generated signal at the carrier frequency or second input signal to retrieve the modulating signal which is equal to the difference between the frequencies of the first and second signals.

In the past, balanced modulators have been comprised of diode bridges and balanced circuits employing tubes or transistors. It is important that the active devices employed in a modulator or demodulator have linear transfer characteristics relating the change in an output signal in response to a change in an input signal in order to avoid the creation of unwanted intermodulation products. Unfortunately, direct current (DC) supplies are required to bias transistors, diodes and vacuum tubes on the linear most portion of their transfer characteristics. However, even with optimum biasing arrangements such devices are still nonlinear.

To avoid utilizing DC biasing supplies and to avoid the nonlinearities of vacuum tubes, diodes and transistors, field-effect transistors (FETs) have recently been incorporated in demodulators and modulators. Since the transfer characteristics of FETs are substantially more linear than the transfer characteristic of transistors, diodes, and vacuum tubes, FET mixing circuits provide improved intermodulation rejection capabilities. However, transformers are required in these improved circuits to cancel undesired modulation products and tuned circuits are required to select desired modulation products. Since transformers and tuned circuits include inductors, the prior art mixing circuits including FETs are not suitable to be provided in integrated circuit form. Moreover, because of the frequency characteristics of the transformers and tuned circuits the prior art mixing circuits are operative only at specific redetermined frequencies which must be separated by some finite amount depending upon the particular circuit configuration.

SUMMARY OF THE INVENTION

One object of this invention is to provide an improved signal mixing circuit.

Another object of this invention is to provide a mixing circuit employing field-effect transistors which does not require frequency dependent devices such as transformers and tuned circuits for its operation and, therefore, facilitates mixing of two sinusoidal signals which have arbitrarily close frequencies.

Still another object of the invention is to provide a circuit for mixing input signals of first and second frequencies which is suitable for use either as a balanced modulator, product detector or in any other application wherein an output signal is desired which has components of significant amplitude only at the sum and difference frequencies of the input signals.

A further object of this invention is to provide a mixing circuit which has a linear transfer characteristic to thereby reduce the generation of unwanted modulation components at its output and which is suitable to be provided in integrated circuit form.

A still further object of this invention is to provide a signal mixing circuit which can be utilized in a frequency range from 0 Hertz to several Megahertz to mix low amplitude input signals.

In brief, a circuit of one embodiment of the invention employs first and second field-effect transistors as linear resistors, a potentiometer, and a differential amplifier to develop an output signal derived from the product of first, second and third sinusoidal input signals. The first input signal has a first frequency and the second and third input signals have a second frequency and are 180° out-of-phase. Such output signal includes signal components having significant amplitudes only at frequencies equal to the sum and difference of the first and second frequencies. The source of the first FET is coupled through the potentiometer to the first input of the differential amplifier and the drain of the first FET is coupled to the drain of the second FET and to the second input of the differential amplifier. The source of the second FET is connected to a ground or reference potential. The first input signal is applied through the potentiometer to the first input of the differential amplifier and through the first FET to the drain of the second FET. The second and third input signals are respectively applied to the gates of the first and second FETs which are operated in their linear regions below pinch-off. Since the gate voltages of the FETs are 180° out-of-phase, the composite resistance presented by the FETs to he first input signal will be constant. Moreover, the third input signal, amplitude modulates the first input signal to produce an amplitude modulated signal at the drain of the second FET. This amplitude modulated signal, which is applied to the second input of the differential amplifier, has frequency components at the sum and difference of the first and second frequencies pulse an unwanted component at the first frequency. The potentiometer can be adjusted such that the amplitude of the first input signal applied to the first input of the differential amplifier is equal to the amplitude of the unwanted component applied to the second input of the differential amplifier. The common mode rejection characteristic of the differential amplifier then cancels out the unwanted frequency component at the first frequency thereby providing only the desired sum and difference frequencies at the output of the differential amplifier.

DETAILED DESCRIPTION OF THE PREFERRED EMBODIMENT

Figure 1:
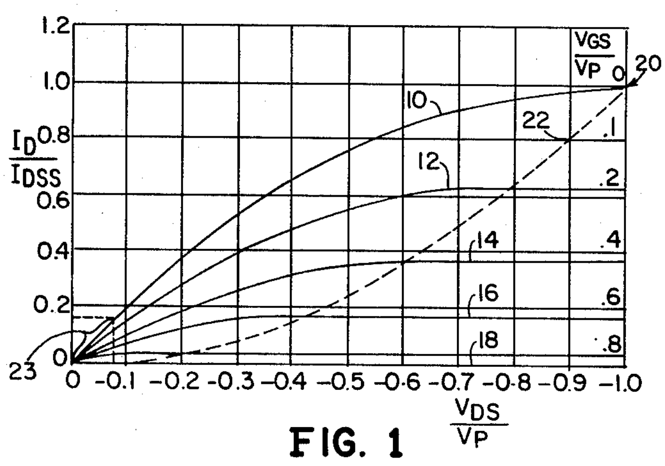
FIG. 1 illustrates a set of first quadrant voltage-current characteristic curves for a hypothetical field-effect transistor below its pinch-off region.

Referring now to FIG. 1, the first quadrant characteristic curves 10, 12, 14, 16 and 18 for a hypothetical or theoretical field-effect transistor (FET) are illustrated. In general, a field-effect transistor can be regarded as a structure containing a semiconductor path, the conductivity of which is determined by the strength of an applied transverse field. This semiconductor path, is of one conductivity type, e.g., N, and runs between the drain and source terminals thereof; and the electric field is applied to a gate terminal of the device which is of the opposite conductivity type, e.g., P.

Curve 10 of FIG. 1 illustrates the relationship between the current flowing between the drain-to-source ($I_D$) for given values of voltage applied between the drain and source($V_{DS}$) provided the voltage between the gate and source ($V_{GS}$) is equal to 0. As the magnitude of the drain-to-source voltage increases above 0 a small amount, as seen from curve 10, the drain current increases in an essentially linear manner therewith. Thus, for low values of drain-to-source voltage, the FET has a voltage-current characteristic nearly identical to the voltage-current characteristics of a passive, linear resistor. However, as the magnitude of the drain-to-source voltage further increases, the drain current becomes an increasingly more nonlinear function thereof until the drain current reaches a constant value where it is no longer a function of the drain-to-source voltage. This point is indicated on curve 10 by point 20. The magnitude of drain-to-source voltage necessary to produce the leveling off of the drain current in response to a gate-to-source voltage equal to 0 is called the pinch-off voltage, $V_P$. The corresponding constant amount of drain current is symbolized by $I_{DSS}$ and is called the saturation current. In FIG. 1, the values of the drain-to-source voltages and the values of the gate-to-source voltages are normalized with respect to the pinch-off voltage, and the drain current is normalized with respect to the saturation current.

As indicated by curves 12, 14, 16 and 18, as the voltage from gate-to-source increases, the value of voltage from drain-to-source necessary to cause a given amount of nonlinearity decreases. The portion of the operating characteristics of the FET where the drain current varies as a function of the voltage from drain-to-source is defined as the "triode region" and includes that portion of the voltage-current characteristic curves of FIG. 1 to the left of dashed line 22.

If an alternating current (AC) signal is impressed between the drain and source electrode and the voltage from gate-to-source is constant, e.g. 0, the operating point of the FET moves up and down along the portion 23 of curve 10 and the resulting change in drain current, $I_D$ is a linear function of the drain-to-source voltage. Thus, the resistance of the channel extending between the drain and source electrodes of the FET does not vary with small AC drain-to-source voltages. However, if the gate-to-source voltage is sinusoidal and the drain-to-source voltage is constant the channel resistance varies with the gate-to-source voltage. Hence, the drain-to-source or channel resistance, R, can be defined as a function of the gate-to-source voltage, $V_{GS}$.

$$R = a\,V_{GS} + b \quad (1)$$

Figures 2, 4:
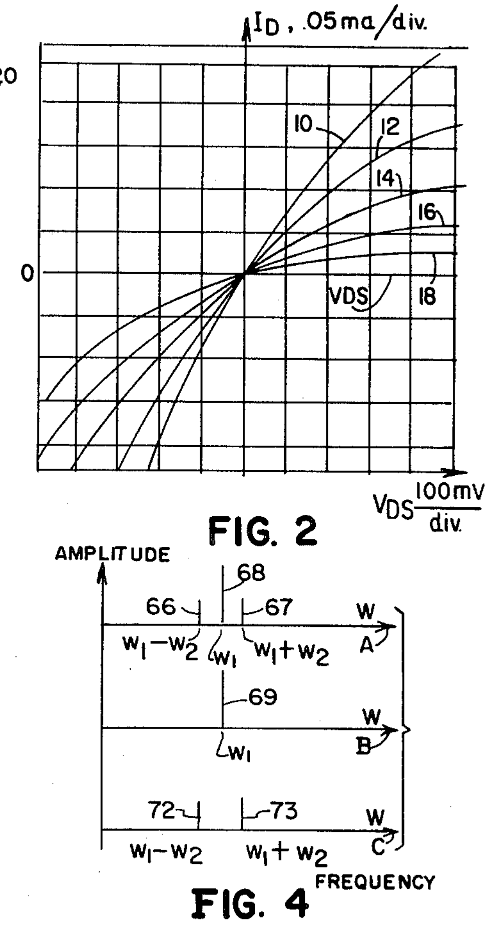
FIG. 2 illustrates a set of first and third quadrant characteristic curves for an actual field-effect transistor.
FIG. 4 is a spectral line, frequency diagram useful in understanding the operation of the signal processing circuit of FIG. 3.

A method of obtaining constants $a$ and $b$ from the characteristic curves of a FET will now be described. In FIG. 2 the first and third quadrant characteristic curves for an actual field-effect transistor are shown. Curves corresponding to the initial portions of those shown in FIG. 1 are given the same reference numbers. The constant "$b$" can be graphically obtained from curve 10, which corresponds to a gate-to-source voltage equal to 0, by determining the inverse of the slope thereof as follows:

$$b = R_{V_{GS}} = 100\text{ mv}/0.075\text{ ma} = 1{,}333\Omega \quad (2)$$

The constant $a$ can be determined by determining the change in resistance for a change in gate-to-source voltage as shown by equation 3.

$$a = \Delta R/\Delta V_{GS} = [2{,}000 - 1{,}333]/[(-0.2) - 0] = 3{,}333\Omega/V \quad (3)$$

Figure 3:
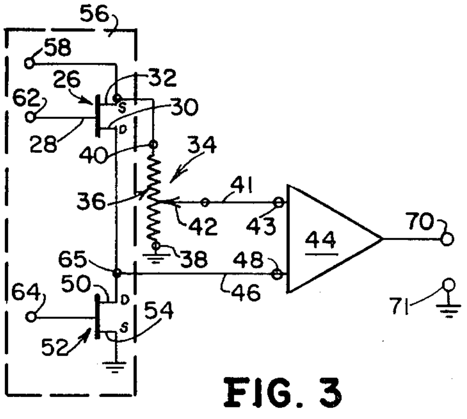
FIG. 3 is a partial block and schematic diagram of the signal processing circuit of one embodiment of the invention.

Referring now to FIG. 3, a signal processing or mixing circuit of one embodiment of the invention is disclosed wherein first field-effect transistor 26 is shown having gate electrode 28, drain electrode 30 and source electrode 32. Potentiometer 34 includes a resistive element 36 having one end 38 thereof connected to a ground or reference potential and another end 40 connected to source 32. Conductor 41 connects the slider or adjustable terminal 42 of potentiometer 34 to a first input 43 of differential amplifier 44. Drain terminal 30 of FET 26 is connected through conductor 46 to second input terminal 48 of differential amplifier 44, and to drain terminal 50 of second field-effect transistor 52. Source terminal 54 of field-effect transistor 52 is connected to a ground or reference potential.

To facilitate analysis of the mixing circuit of FIG. 3, first consider the portion of the circuit included in dashed box 56. A first sinusoidal input signal, $v_i$, of a first frequency, $w_i$, is applied to terminal 58 and second and third sinusoidal input signals $v_1$ and $v_2$ of frequencies $w_1$ and $w_2$, are respectively applied between the gate terminals 62 and 64 and source terminals 32 and 54 of FETs 26 and 52 which are operated in their linear or triode regions. The voltage at terminal 65, $v_o$ may be expressed as follows:

$$v_o = [v_i(a_2 v_2 + b_2)]/[a_1 v_1 + b_1 + a_2 v_2 + b_2] \quad (4)$$

wherein:

$v_i = V_i \text{ COS } w_i t$ $v_1 = V_1 \text{ COS } w_1 t$ $v_2 = V_2 \cos w_2 t$ Constants $a_1$, $b_1$ and constants $a_2$, $b_2$ are derived from the characteristic curves of respective FETs 26 and 52 by the previously described procedure.

If the sinusoidal voltages $v_1$ and $v_2$ applied respectively between the gate-source terminals of FETs 26 and 52 have the same frequency but are 180° out-of-phase and if they are adjusted such that their amplitudes, $V_1$ and $V_2$, are equal then $$a_1 v_1 = a_2 v_2 \qquad (5)$$

Accordingly, the second and third input signals ($v_1$, $v_2$) cancel each other from the denominator of equation 4. This results in the voltage, $v_{o_1}$, at point 65 being expressed as $$v_{o_1} = \frac{v_i a_2 v_2}{b_1 + b_2} + \frac{v_i b_2}{b_1 + b_2} \qquad (6)$$

Equation 6 represents an amplitude modulated signal having desired sideband components which are designated by spectral lines 66 and 67 of FIG. 4A, and an undesired carried ($v_i$) component designated by spectral line 68.

Since the voltages applied to the gates of FETs 26 and 52 are 180° out-of-phase, the resistance offered by FET 26 is high when the resistance developed by FET 52 is low, and vice-versa. Accordingly, the "composite resistance" between point 58 and the reference potential, developed by the FETs connected therebetween, is virtually constant. Thus, the second and third input signals applied to gates 62 and 64 do not modulate the input signal, $v_i$ developed at point 58 and across potentiometer 34. Adjustable element 42 of potentiometer 34 can be set between points 38 and 40 such that the voltage $v_{o_2}$, developed at adjustable element 42 is equal to the second term on the right side of the equal sign of equation 6. Therefore, $$v_{o_2} = (v_i b_2)/(b_1 + b_2) \qquad (7)$$

Equation 7 represents a sinusoidal signal component at frequency $w_i$ which is designated by spectral line 69 of FIG. 4B.

The voltage, $v_{o_2}$ developed at adjustable element 42, is applied through conductor 41 to first input 43 of differential amplifier 44 and the voltage $v_{o_1}$, developed at terminal 65, is applied through conductor to second input 48 of differential amplifier 44. Because of the common-mode rejection property of differential amplifier 44, the common-mode signals 68 and 69, are eliminated. Thus, the output signal, $v_o$ developed between differential outputs 70 and 71 is expressed by equation:

$$v_{o_3} = g_s [(v_i a_2 v_2)/(b_1 + b_2)] \qquad (8)$$

wherein $g_s$ is the gain of differential amplifier 44. Since $v_i = V_i \cos w_i t$ and $v_2 = V_2 \cos w_2 t$ equation 8 can be written as follows:

$$v_{o_3} = g_s[(V_i V_2 a_2)/(b_1 + b_2)](\cos w_i t \cos w_2 t) \qquad (9)$$

Expanding the product of the cosines gives the following result:

$$v_{o_3} = g_s \frac{V_i V_2 a_2}{2(b_1 + b_2)} [\cos (w_i + w_2)t + \cos (w_i - w_2)t] \qquad (10)$$

From equation 10 it can be seen that the FETs should be chosen so that constant $a_2$ is large and the constants $b_1$ and $b_2$ are small to facilitate the generation of sum and difference signal components having maximum amplitudes. Also from equation 10 it is seen that the output of differential amplifier 44 contains only components having frequencies equal to the sum and the difference of the frequencies of the signals applied to terminals 58 and 64 of the signal mixing circuit shown in FIG. 3. These frequency components are designated by spectral lines 72 and 73 in FIG. 4C.

If the circuit of FIG. 3 is employed as the modulator in a double sideband suppressed carrier transmitter, the modulating signals could be applied to terminals 62 and 64 and the carrier signal could be applied to terminal 58. The resulting differential output $v_{o_3}$, as shown by equation 10, has frequencies equal to the carrier frequency plus the modulating frequency and the carrier frequency minus the modulating frequency. Neither the carrier signal nor the modulating signal occur to any substantial extent at the output of differential amplifier 44. The double sideband, suppressed carrier output of differential amplifier 44 could be either multiplied up in frequency or merely amplified and transmitted. Alternatively, if the circuit of FIG. 3 is employed in a single sideband, suppressed carrier transmitter, a filter could be connected between an output thereof and the succeeding stage to select a desired sideband which could be amplified and transmitted.

Furthermore, the circuit of FIG. 3 might be employed also as a product detector for demodulating single sideband, suppressed carrier signals. In this application the first input signal, $v_i$ could be the upper sideband to be demodulated and second and third input signals, $v_1$ and $v_2$, might be at the carrier frequency. As shown by equation 10, the mixing circuit would produce an output signal, $v_{o_3}$ , having components at the sum and the difference of the upper sideband, and carrier frequency. The signal component at the difference frequency is the modulating signal. A filter, having a cutoff frequency greater than the uppermost frequency of the modulating signal, could be connected between output 70 and the ground or reference potential 71 for deriving the demodulated frequency. Many other applications of the mixing circuit shown in FIG. 3 can be devised by those skilled in the art and the circuit can be employed in applications other than those involving communications.

The circuit of FIG. 3 has many advantages over mixing circuits employing transistors, vacuum tubes and diodes for low level signal processing applications. For instance, referring to FIGS. 1 and 2, it is apparent that if the drain-to-source voltage and gate-to-source input voltages applied to the FETs are at low levels the output characteristics remain linear. Transistors, diodes and vacuum tubes; however, have output characteristics which are more nonlinear than those of a FET for low level input signals. These nonlinear characteristics tend to create unwanted spurious and intermodulation components having significant amplitudes at the output of these active devices. The frequencies of these unwanted components may fall within the passband characteristics of subsequent circuits, e.g. intermediate frequency amplifiers, thereby enabling the unwanted signals to be amplified and applied to the output of the system.

Also, bias supplies are required to situate the operating point of tubes, transistors, and diodes near their linear most regions of operation. However, as illustrated by FIG. 2, the characteristics of FETs 26 and 52 are linear in both the first and third quadrants within a range of drain-to-source voltages either side of zero volts. Therefore, the FETs don't require a bias potential to be applied to the gates thereof. Hence, the foregoing bias supplies are not required. Moreover, prior art mixing circuits utilize transformers or tuned circuits to cancel and select signal components, whereas the circuit in FIG. 3 uses differential amplifier 44 for cancellation. Accordingly, the mixing circuit of FIG. 3 is more susceptible to integration than the prior art FET mixers. Furthermore, since there are no tuned circuits or transformers used in the mixing circuit of FIG. 3, it is capable of mixing signals lying within a range extending from DC to several megacycles; and the frequencies of the mixing signals, e.g. $w_i$ and $w_2$ can be arbitrarily close together.

Figure 5:
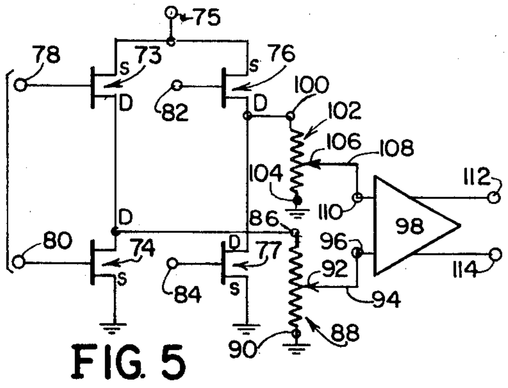
FIG. 5 is a partial block and schematic diagram of a second embodiment of the invention.

Another embodiment of a mixing circuit of the invention, which has the same advantages as the circuit of FIG. 3, is shown in FIG. 5. FETs 73 and 74 are connected in series to form a leg of a bridge circuit extending from a first input terminal 75 to the reference potential. Terminal 75 is connected to the sources of FETs 73 and 76. Similarly, FETs 76 and 77 are connected to form the other leg. Second and third input terminals 78 and 80 are respectively connected to the gates of FETs 73 and 74 and fourth and fifth input terminals 82 and 84 are respectively connected to the gates of FETs 76 and 77. The drain of FET 73 and the drain of FET 74 are connected to one end 86 of the resistive element of potentiometer 88. The other end 90 of the resistive element of the potentiometer 88 is connected to a ground or reference potential, and adjustable terminal 92 is connected through conductor 94 to a first input 96 of differential amplifier 98. Similarly, the drain of FET 76 and the drain of FET 77 are connected to one end 100 of the resistive element of potentiometer 102. The other end 104 of potentiometer 102 is connected to a ground or reference potential, and adjustable terminal 106 is coupled through conductor 108 to a second input 110 of differential amplifier 98. The output of differential amplifier 98 may be derived between terminals 112 and 114 or between either of them and the reference potential.

A first sinusoidal input signal $V'_i$ of a first frequency, $w'_i$ is applied to input terminal 75, a second input signal $v'_1$ is applied to terminals 78 and 84, and a third input signal $v'_2$ is applied to terminals 80 and 82. The second and third input signals are of equal frequency and they are 180° out-of-phase with each other. The signal $v'_{o1}$ developed at terminal 86 of potentiometer 88 may be expressed as follows:

$$v'_{o1} \cong \frac{v'_i a'_2 v'_2}{b'_1 + b'_2} + \frac{v'_i b'_2}{b'_1 + b'_2} \qquad (11)$$

Wherein, $b'_1$ and $a'_2$, $b'_2$ are constants derived for FETs 73 and 74, respectively, by the previously described procedure. Equation 11 represents an amplitude modulated signal having desired sideband frequencies represented by the first term on the right side of the equal sign and an undesired component at the frequency of the first input signal represented by the second term on the right side of the equal sign. Similarly, the signal $v'_{o2}$ applied to terminal 100 of potentiometer 102 may be expressed as follows:

$$v'_{o2} \cong \frac{v'_i a_4 v'_1}{b_3 + b^4} + \frac{v'_i b_4}{b_3 + b_4} \qquad (12)$$

wherein, $b_3$ and $a_4$, $b_4$ are constants derived for FETs 76 and 77, respectively.

Equations 11 and 12 except for a scaling factor introduced by the potentiometers, respectively represent the input signal, $v'_{o1}$, applied to the first input 110 of differential amplifier 98 and the input signal, $v'_{o2}$, applied to the second input 96 of differential amplifier 98. These input signals are amplitude modulated sine waves. The first term on the right hand side of the equal sign in each equation expresses the upper and lower sideband frequencies for the amplitude modulated waves which are 180° out-of-phase with each other and of equal frequency. The second term on the right hand side of the equal sign in each of the equations represents the carrier or unwanted signal component thereof. These carrier components are of equal amplitude, frequency and in-phase with each other. The common-mode rejection characteristic of differential amplifier 98 cancels the undesired carrier signal component and reverses the phase of the upper and lower sidebands of the first input signal, $v'_{o1}$, with respect to the phase of the upper and lower sidebands of the second input signal, $v'_{o2}$. Hence, the sideband frequency components are brought into phase and add to each other to provide an output signal, $v'_{o3}$ having components at the sum and difference frequencies of the first and second frequencies. The expressions of equations 11 and 12 are approximate because they are altered slightly by potentiometers 88 and 102 which are used to equalize the undesired $v'_i$ terms of equations 11 and 12. Thus, the mixing circuit of FIG. 5, likewise, provides frequency components having significant amplitudes only at the sum and difference of first and second input frequencies.

More specifically, if $v'_{o1}$ and $v'_{o2}$, are adjusted by adjusting the potentiometers 88 and 102, such that the second terms on the right side of the equal sign thereof are of equal magnitude then since the $v'_i$ components are in phase, the common-mode rejection characteristic of differential amplifier 98 will eliminate them thus output, $v'_{o3}$ is:

$$v'_{o3} = g_s \left[ \frac{v_i a'_2 v'_2}{b'_1 + b'_2} + \frac{v'_i a_4 v'_2}{b_3 + b_4} \right] \qquad (13)$$

Assuming that the input signals are sinusoidal signals of the form $v'_i = V'_i \cos w'_i t$ and $v'_2 = V'_2 \cos w'_2 t$ the output signal, $v'_{o3}$ may be expressed as:

$$v'_{o3} = g_s V'_i V'_2 \left[ \frac{a'_2}{b'_1 + b'_2} + \frac{a_4}{b_3 + b^4} \right] [\cos(w'_i + w'_2) + \cos(w'_i - w'_2)] \qquad (14)$$

Figure 6:
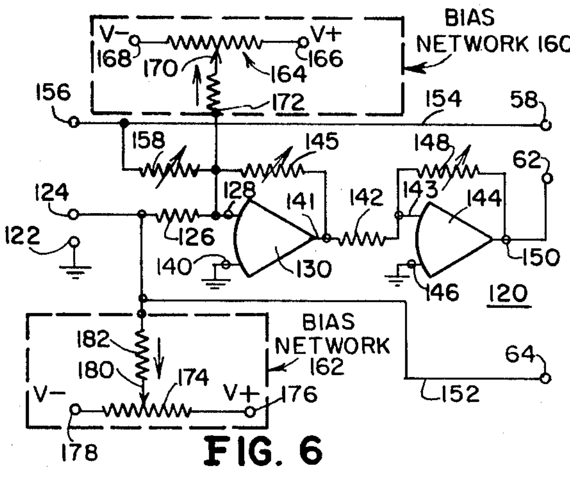
FIG. 6 is a partial block and schematic diagram of a driving circuit suitable for being employed with the signal processing circuit of FIG. 3.

To facilitate utilization of the mixing circuit of FIG. 3, it is pointed out that equation 4 is based on the assumptions that input voltages, $v_1$ and $v_2$ are the gate-to-source voltages of FETs 26 and 52, that they are 180° out-of-phase with each other and that they have equal magnitudes. Driver circuit 120 of FIG. 6 may be connected to the mixing circuit of FIG. 3 to assure that the gate-to-source voltages of FETs 26 and 52 fulfill the foregoing assumptions.

Circuit 120 includes first input terminal 122 which is connected to ground or reference potential. Second input terminal 124, is coupled through resistor 126 to inverting input terminal 128 of operational amplifier 130. Noninverting input terminal 140 of operational amplifier 130 is connected directly to ground. Output terminal 141 of amplifier 130 is connected through summing resistor 142 to inverting input 143 of second operational amplifier 144. Variable feedback resistor 145 connects output terminal 141 of operational amplifier 130 to inverting input terminal 128. Noninverting input terminal 146 of operational amplifier 144 is connected to ground or reference potential. Variable feedback resistor 148 is connected from the output 150 of operational amplifier 144 to input 143. Output terminal 150 of operational amplifier 144 is connected to terminal 62 of the mixing circuit of FIG. 3.

Conductor 152 connects second input terminal 124 of driving circuit 122 to terminal 64 of the mixing circuit of FIG. 3. Conductor 154 connects third input terminal 156 of driver circuit 120 to terminal 58 of the mixing circuit of FIG. 3. Variable resistor 158 connects third input terminal 156 to inverting input terminal 128 of operational amplifier 130.

In operation, a driving signal is developed between terminals 124 and 126, and conducted by conductor 152 to terminal 64 of the mixing circuit of FIG. 3 to develop the third input signal, $v_3$ between the gate and source of FET 52. The driving signal also is passed through operational amplifier 130 wherein it receives a first phase reversal, and through operational amplifier 144 wherein it receives a second phase reversal. The driving signal is applied from the output of operational amplifier 144 to terminal 62 of the mixing circuit of FIG. 3 to form the second input signal, $v_2$ between the gate and source of FET 26. Even though the gate signals of the FETs are in phase with each other, the gate-to-source voltage of FET 26 is 180° out-of-phase with the gate-to-source voltage of 52. The amplitude of the second input signal is adjusted so that it is equal to the amplitude of the first input signal by adjusting either the gain of operational amplifier 130 by changing variable resistor 146 or the gain of amplifier 144 by changing variable resistor 148. Therefore, driving circuit 120 enables the condition expressed by equation 5 and the assumptions of equation 4 to be met.

The first input signal, $v_l$ is applied to third input terminal 156 of driver circuit 120 and conducted through conductor 154 and terminal 58 of the mixing circuit of FIG. 3, to source 32 of FET 26. It is important that the first input signal not contribute to the gate-to-source voltage of FET 26. Therefore, it is desirable to cause the potential on gate 28 to move up and down with the potential at source 32 resulting from signal, $v_l$. Thus, variable resistor 158, and operational amplifiers 130 and 144 provide a path for signal, $v_l$ from input terminal 156 to terminal 62 of the mixing circuit of FIG. 3. Variable resistor 158 is adjusted so that the portion of signal, $v_l$ impressed on gate 28 of FET 26 cancels the effect of the signal $v_l$ produced at source terminal 32 with respect to the gate-to-source voltage of FET 26. This operation does not interfere with the development of signal, $v_l$ between the drain and source of FET 52.

Bias networks 160 and 162 facilitate variation of the bias on FETs 26 and 52 so that the constants *a* and *b* of equation 1 for each of the FETs can be adjusted. Bias network 160 includes a potentiometer 164 having a resistive element with one end 166 connected to a positive bias supply and another end 168 connected to a negative bias supply. Movable tap 70 of the potentiometer is coupled through resistor 172 to one end of variable resistor 158 and to input terminal 128 of operational amplifier 130. Bias networks 162 includes potentiometer 174 having a resistive element with one end 176 connected to a positive bias voltage and another end 178 connected to a negative positive voltage. Movable tap 180 is connected through resistor 182 and conductor 152 to the gate of FET 52. Moreover, movable tap 180 is connected through resistor 182 and resistor 126 to input terminal 128 of operational amplifier 130. The ground or reference potential at terminal 140 of operational amplifier 130, in essence, assures that a ground potential occurs at input terminal 128 thereof so that none of the bias voltage from network 160 is applied through variable resistor 158, conductor 154, terminal 58, potentiometer 34, to input 41 of differential amplifier 44. Since bias network 160 is connected through resistor 126 and conductor 64 to input 64 of the mixing circuit of FIG. 3 it is necessary to utilize bias network 162 to balance out the effect of bias network 160 on FET 52.

Driving circuit 120 except for the potentiometers and variable resistors, can be provided in integrated circuit form. In many applications, some or all of the variable resistors or potentiometers can be replaced by resistors of fixed value which also can be integrated. Two driving circuits of the form shown in FIG. 6 could be adapted by one skilled in the art to drive the circuit of FIG. 5. Furthermore, driving circuits of other configurations could be developed.

What has been described, therefore, is an improved signal mixing circuit which employs the linear portions of the characteristics of a plurality of field-effect transistors and which does not require frequency dependent devices such as transformers and tuned circuits for its operation. Therefore, a mixing circuit of this embodiment of the invention facilitates mixing of two sinusoidal signals which may have arbitrarily close but different frequencies. Moreover, because no frequency dependent devices are used therein, the mixing circuit can be utilized in a frequency range extending from 0 Hertz to several Megahertz. Provided that the mixing circuit is driven by low amplitude mixing signals, the substantially linear characteristics of the FET's greatly reduce the possibility of production of unwanted intermodulation components. Furthermore, because the mixing circuit doesn't include any inductors, it is suitable for being provided in integrated circuit form. Therefore, the mixing circuit is capable of being produced in a package which takes up less space and has less weight than packages including mixing circuits formed from discrete components.

I claim:

1. A signal processing circuit for combining a first signal having a first frequency with second and third signals each having a second frequency to form a mixing product including virtually only signal components having frequencies equal to the sum and the difference of the first and second frequencies, the signal processing circuit including in combination:

first voltage variable resistance means having a linear characteristic and first, second and third electrodes, said first electrode being adapted to receive the first signal, said second electrode being adapted to receive the second signal;

second voltage variable resistance means having a linear characteristic and first, second and third electrodes, said third electrode of said second voltage variable resistance means being connected to said third electrode of said first voltage variable resistance means, said second electrode of said second voltage variable resistance means being adapted to receive the third signal;

said first and second voltage variable resistance means being responsive to said second and third signals such that the resistance between said first electrode of said first voltage variable resistance means and said first electrode of said second voltage variable resistance means is substantially constant, and the resistance of said second voltage variable resistance means being responsive to said third signal to amplitude modulate said first signal to produce a first amplitude modulated signal occurring at said third electrode of said first voltage variable resistance means having first frequency components at said first frequency and at frequencies equal to the sum and difference of said first and second frequencies;

amplifier means having a common-mode rejection characteristic, first and second input terminals and an output terminal;

first circuit means including third resistance means connecting said first electrode of said first voltage variable resistance means to said first input terminal of said amplifier means to enable second signal components at the first frequency of said first signal to be applied thereto, said third resistance means having a resistance characteristic which equalizes the amplitudes of said second signal components to the amplitudes of said first frequency components;

second circuit means connecting said third electrode of said second voltage variable resistance means to said second input terminal of said amplifier means so that said first amplitude modulated signal is applied thereto; and said amplifier means developing the desired mixing product at said output terminal thereof.

2. The signal processing circuit of claim 1 wherein said first and second voltage variable resistance means are first and second field-effect transistor means having a pinch-off voltage and said first, second and third electrodes thereof are the respective source, gate and drain thereof; and said first, second and third signals have amplitudes which are relatively small compared to said pinch-off voltage so that said first and second field-effect transistor means are operated on the linear portion of their characteristics.

3. The signal processing circuit of claim 1 wherein said third resistance means is a potentiometer.

4. The signal processing circuit of claim 1 wherein said first circuit means includes:

third voltage variable resistance means having a linear characteristic and first, second and third electrodes, said first electrode of said third voltage variable resistance means being connected to said first electrode of said first voltage variable resistance means, said second electrode of said third voltage variable resistance means being adapted to receive the third signal;

third circuit means connecting said third electrode of said third voltage variable resistance means to said first input terminal of said amplifier means;

fourth voltage variable resistance means having a linear characteristic and first, second and third electrodes, said third electrode of said fourth voltage variable resistance means being connected to said third electrode of said third voltage variable resistance means, said second electrode of said fourth voltage variable resistance means being adapted to receive the second signal;

said third and fourth voltage variable resistance means being responsive to the first, second and third signals to provide a second amplitude modulated signal to said first input terminal of said amplifier means having said second frequency components of equal frequency and in phase with said first frequency components being applied to said second input terminal of said amplifier means, and second frequency components of equal frequency but 180° out-of-phase with said first frequency components at said sum and difference of said first and second frequencies being applied to said second input terminal of said amplifier means; and said amplifier means being responsive to said frequency components being applied to said first and second input terminals thereof to cancel said first and second components at said first frequency and reverse the phase of said first and second components occurring at said frequencies equal to the sum and difference of said first and second frequencies so that they occur in phase with each other at said output terminal of said amplifier means.

5. The signal processing circuit of claim 4 wherein said third voltage variable resistance means is a third field-effect transistor having a pinch-off voltage and said first, second and third electrodes thereof are the respective source, gate and drain electrodes thereof; and said first and third signals having amplitudes which are relatively small compared to said pinch-off voltage so that said third field-effect transistor means is operated only on the linear portion of its characteristic.

6. The signal processing circuit of claim 4 wherein said fourth voltage variable resistance means is a fourth field-effect transistor having a pinch-off voltage and said first, second and third electrodes thereof are the source, gate and drain electrodes of said fourth field-effect transistor; and said second input signal has a relatively low amplitude with respect to said pinch-off voltage of said fourth field-effect transistor means so that said fourth field-effect transistor is operated only on the linear portion of its characteristic.

7. The signal processing circuit of claim 4 wherein said second and third circuit means are potentiometers.

8. The signal processing circuit of claim 1 wherein said amplifier means having a common mode rejection characteristic is a differential amplifier having first and second differential inputs corresponding to said first and second inputs.

* * * * *